(12) United States Patent
Liu et al.

(10) Patent No.: US 11,742,334 B2
(45) Date of Patent: Aug. 29, 2023

(54) LIGHT-EMITTING ASSEMBLY WITH RAISED ADHESIVE LAYER

(71) Applicant: XIAMEN SAN'AN OPTOELECTRONICS CO., LTD., Xiamen (CN)

(72) Inventors: Tung-Kai Liu, Xiamen (CN); Shao-Ying Ting, Xiamen (CN); Chen-Ke Hsu, Xiamen (CN); Chia-En Lee, Xiamen (CN)

(73) Assignee: Xiamen San'An Optoelectronics Co., Ltd., Fujian (CN)

( * ) Notice: Subject to any disclaimer, the term of this patent is extended or adjusted under 35 U.S.C. 154(b) by 0 days.

(21) Appl. No.: 17/081,205

(22) Filed: Oct. 27, 2020

(65) Prior Publication Data

US 2021/0066262 A1 Mar. 4, 2021

Related U.S. Application Data

(63) Continuation-in-part of application No. PCT/CN2018/090673, filed on Jun. 11, 2018.

(51) Int. Cl.
*H01L 29/20* (2006.01)
*H01L 33/00* (2010.01)
(Continued)

(52) U.S. Cl.
CPC .......... *H01L 25/0753* (2013.01); *H01L 24/81* (2013.01); *H01L 25/167* (2013.01);
(Continued)

(58) Field of Classification Search
CPC ... H01L 25/0753; H01L 24/81; H01L 25/167; H01L 2224/81005; H01L 2224/81007;
(Continued)

(56) References Cited

U.S. PATENT DOCUMENTS 8,803,168 B2 * 8/2014 Matsumoto ......... H01L 25/0753
257/99
9,466,770 B2 * 10/2016 Sato .................... C09K 11/7774
(Continued)

FOREIGN PATENT DOCUMENTS

| CN | 1698077 A | 11/2005 |
|---|---|---|
| CN | 107408603 A | 11/2017 |
| CN | 107978548 A | 5/2018 |

OTHER PUBLICATIONS

Search Report Issued To PCT Application No. PCT/CN2018/090673 By the WIPO dated Feb. 27, 2019.
(Continued)

*Primary Examiner* — Ismail A Muse
(74) *Attorney, Agent, or Firm* — Rosenberg, Klein & Lee

(57) ABSTRACT

A light emitting assembly includes a substrate, an adhesive layer on the substrate, and a plurality of light emitting units on the adhesive layer. Each of the light emitting units includes a first-type semiconductor layer, a second-type semiconductor layer, an active layer disposed between the first-type and second-type semiconductor layers, a first electrode electrically connected to the first-type semiconductor layer, and a second electrode electrically connected to the second-type semiconductor layer. A light emitting apparatus including the light emitting assembly is provided. Methods for making the light emitting assembly and the light emitting apparatus are provided.

4 Claims, 4 Drawing Sheets

(51) Int. Cl.
*H01L 25/075* (2006.01)
*H01L 23/00* (2006.01)
*H01L 25/16* (2023.01)

(52) U.S. Cl.
CPC ............ *H01L 2224/81005* (2013.01); *H01L 2224/81007* (2013.01)

(58) Field of Classification Search
CPC ............ H01L 33/0093; H01L 33/0095; H01L 21/683; H01L 21/6835; H01L 27/156; H01L 33/005; H01L 2221/68322; H01L 2221/68363; H01L 21/52
See application file for complete search history.

(56) References Cited

U.S. PATENT DOCUMENTS

| | | | | |
|---|---|---|---|---|
| 2004/0201787 | A1* | 10/2004 | Sekiguchi | B41J 2/465 349/110 |
| 2006/0003483 | A1* | 1/2006 | Wolff | H01L 31/0203 257/E31.117 |
| 2006/0049423 | A1* | 3/2006 | Yamaguchi | H01L 33/62 257/E33.073 |
| 2008/0149960 | A1* | 6/2008 | Amo | H01L 33/505 257/E33.061 |
| 2012/0029110 | A1* | 2/2012 | Washiya | G11B 5/855 522/182 |
| 2012/0261699 | A1* | 10/2012 | Ooyabu | H01L 33/505 257/E33.061 |
| 2013/0240923 | A1* | 9/2013 | Hsu | H01L 33/38 438/34 |
| 2013/0285086 | A1* | 10/2013 | Hu | H01L 24/95 257/98 |
| 2016/0336484 | A1* | 11/2016 | McGroddy | H01L 33/06 |
| 2017/0170049 | A1* | 6/2017 | Hu | H01L 24/93 |
| 2018/0138162 | A1* | 5/2018 | Takeya | H01L 24/19 |
| 2018/0204973 | A1* | 7/2018 | Jeung | H01L 33/0093 |
| 2018/0277524 | A1* | 9/2018 | Moon | H01L 33/22 |
| 2019/0051792 | A1* | 2/2019 | Lo | H01L 25/167 |
| 2019/0189858 | A1* | 6/2019 | Li | G02B 5/288 |
| 2019/0348392 | A1* | 11/2019 | Chen | H01L 24/799 |
| 2020/0286949 | A1* | 9/2020 | Lee | H01L 23/544 |
| 2020/0373282 | A1* | 11/2020 | Liu | H01L 25/167 |

OTHER PUBLICATIONS

Search Report appended to an Office Action, which was issued to Chinese counterpart application No. 201880025489.4 by the CNIPA dated Sep. 28, 2022, with an English translation thereof.

* cited by examiner

LIGHT-EMITTING ASSEMBLY WITH RAISED ADHESIVE LAYER

CROSS-REFERENCE TO RELATED APPLICATION

This application is a bypass continuation-in-part (CIP) application of PCT International Application No. PCT/CN2018/090673, filed on Jun. 11, 2018. The entire content of the PCT International application is incorporated herein by reference.

FIELD

The disclosure relates to a light emitting assembly, a light emitting apparatus, and methods for making the same.

BACKGROUND

In the current market, micro light emitting diode (micro LED) chips are applied in various optoelectronic devices such as biosensors, automotive lighting, displays, flexible devices, optical communication and visual reality devices. The miniatured structure of the micro LED chips leads to a reduction in line width (or spacing) of an electronic device containing the micro LED chips, and an increase in external quantum efficiency of the optoelectronic devices. However, the transfer process of such micro LED chips is time-consuming. For instance, if the transfer process is executed using a conventional surface mount system, the transfer of six million micro LED chips in a batch manner would take one month, which is relatively inefficient.

In a conventional batch production of a light emitting device, a pick-and-place procedure for transferring the micro LED chips would cause pressure and thermal changes between a transfer head of the surface mount system and a permanent substrate (e.g., a circuit board) on which the micro LED chips are to be disposed, which might adversely affect bonding strength of the micro LED chips to the permanent substrate. Moreover, the permanent substrate might be damaged by the repeated pick-and-place procedure.

SUMMARY

Therefore, an object of the disclosure is to provide a light emitting assembly that can alleviate at least one of the drawbacks of the prior art.

According to an aspect of the disclosure, the light emitting assembly includes a substrate, an adhesive layer disposed on the substrate in a first direction, and a plurality of light emitting units disposed on the adhesive layer opposite to the substrate in the first direction.

Each of the light emitting units includes a first-type semiconductor layer, a second-type semiconductor layer, an active layer that is disposed between the first-type and second-type semiconductor layers, a first electrode that is electrically connected to the first-type semiconductor layer, and a second electrode that is electrically connected to the second-type semiconductor layer.

According to another aspect of the disclosure, a light emitting apparatus includes a circuit board and the aforesaid light emitting assembly which is electrically connected to the circuit board.

According to yet another aspect of the disclosure, a method for making a light emitting assembly includes forming an adhesive layer on a substrate, providing a plurality of light emitting units that are divided into multiple groups, and attaching the light emitting units to the adhesive layer.

According to still yet another aspect of the disclosure, a method for making a light emitting apparatus includes bonding the light emitting assembly made by the aforesaid method to a circuit board.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
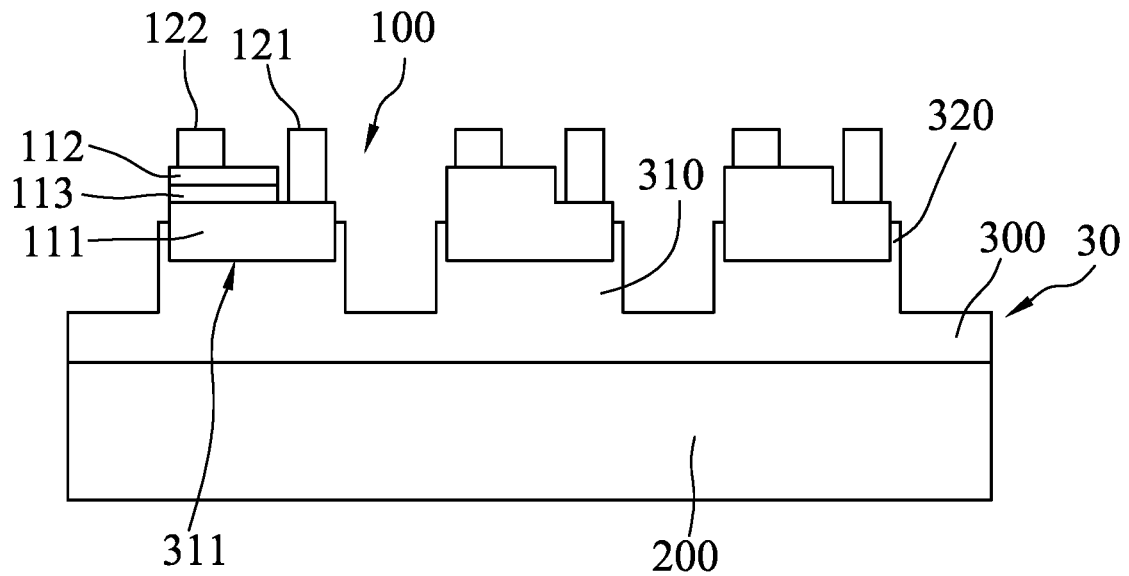
FIG. 1 is a schematic diagram illustrating a first embodiment of a light emitting assembly according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a light emitting assembly, which is configured to be directly bonded to a circuit board 400 (see FIG. 5), includes a substrate 200, an adhesive layer 30 disposed on the substrate 200 in a first direction, and a plurality of light emitting units 100 that are disposed on the adhesive layer 30 opposite to the substrate 200 in the first direction.

Each of the light emitting units 100 includes a first-type semiconductor layer 111, a second-type semiconductor layer 112, an active layer 113 that is disposed between the first-type and the second-type semiconductor layers 111, 112, a first electrode 121 that is electrically connected to the first-type semiconductor layer 111, and a second electrode 122 that is electrically connected to the second-type semiconductor layer 112.

The substrate 200 is used to stably and temporarily sustain the light emitting units 100, and is made of a material, e.g., sapphire, gallium arsenide, silicon, or silicon carbide. The substrate 200 may also be made of a composite material. The substrate can endure a high temperature up to 350° C. The structural stability of the substrate 200 can provide a high matching accuracy between the light emitting units 100 and the circuit board 400. In some embodiments, the substrate 200 is made of an adhesive material, and thus exhibits support and adhesion properties.

The adhesive layer 30 is used to attach the light emitting units 100 to the substrate 200, and is made of a material, e.g., polyimide, UV curable adhesive, thermal curable adhesive, hydrolysis glue, or silica gel. To improve the adhesion property, the adhesive layer 30 may be patterned or roughened. The adhesive layer 30 may be a continuous layer or a discontinuous layer, and may have a thickness ranging from 5 μm to 500 μm in the first direction. In certain embodiments, the adhesive layer 30 has a Shore A hardness ranging from 15 to 90. In some embodiments, the Shore A hardness of the adhesive layer 30 ranges from 15 to 50. For efficiently releasing the light emitting units 100 from the adhesive layer 30, after the light emitting units 100 are transferred from the substrate 200 to a permanent support (e.g., the circuit board 400), the adhesion property of the adhesive layer 30 may be reduced by subjecting the adhesive layer 30 to physical treatment or chemical treatment. In this embodiment, the adhesive layer 30 has a continuous base portion 300 and a plurality of protrusions 310 that are disposed on the base portion 300 and that are spaced apart from each other. The light emitting units 100 are respectively disposed on the protrusions 310. The design of the protrusions 310 would facilitate the efficient release of the light emitting units 100 from the adhesive layer 30. In some embodiments, the base portion 300 has a thickness in the first direction ranging from 5 μm to 500 μm in the first direction.

Each of the protrusions 310 is a platform that has an upper surface 311, and each of the light emitting units 100 is in direct contact with the upper surface 311 of a respective one of the protrusions 310. The shape of each of the protrusions 310 may be varied according to actual needs, and may be prism-shaped, cylinder-shaped or frustum-shaped. For example, the protrusions 310 is a rectangular cylinder, circular cylinder, etc. In certain embodiments, a minimum distance between two adjacent ones of the protrusions 310 ranges from 20 μm to 1200 μm. Each of the protrusions 310 may have a thickness in the first direction greater than that of each of the light emitting units 100. In some embodiments, the thickness of each of the protrusions 310 is at least three times that of each of the light emitting units 100. In certain embodiments, each of the protrusions 310 has a thickness in the first direction ranging from 10 μm to 100 μm. In certain embodiment, the thickness of each of the protrusions 310 ranges from 10 μm to 20 μm.

In certain embodiments, each of the protrusions 310 has an extending portion 320 that at least partially covers a lateral surface of the respective one of the light emitting units 100. The extending portion 320 of each of the protrusions 310 has a thickness in the first direction greater than 0 μm and not greater than 10 μm.

In certain embodiments, the light emitting units 100 are disposed on the adhesive layer 30 in a desired arrangement. In some embodiments, the light emitting units 100 are divided into multiples groups, and the groups are sequentially arranged on the adhesive layer 30 in a batch manner. Thereafter, all of the light emitting units 100 on the adhesive layer 30 can be transferred onto the permanent support in a single transferring step. The groups of the light emitting units 100 are different in, e.g., light color/light color combination of the light emitting units 100, arrangement (e.g., arranging pattern) of the light emitting units 100 on the adhesive layer 30, structures of the light emitting units 100, etc.

The light emitting units 100 may be divided based on the particular light color combination, e.g., blue-blue-blue (B-B-B) group, blue-green-red (B-G-R) group, blue-green-green-red (B-G-G-R) group, blue-green-green-red-red (B-G-G-R-R) group, blue-green-red-red (B-G-R-R) group, etc. The different combinations in light color and/or number of the light emitting unit 100 may achieve different visual or optical effects.

The light emitting units 100 may also be divided based on structures thereof, i.e., dimension (e.g., length, width, thickness), shape, and area of a light exiting surface.

In this disclosure, with inclusion of the adhesive layer 30, all of the light emitting units 100 may be directly bonded to a circuit board 400 in a single transferring step, which is time-saving as compared to the conventional pick-and-place procedure. Moreover, due to the single transferring step, damage to the light emitting unit 100 and the circuit board 400 may be minimized so that the production and transferring costs are reduced.

The adhesive layer 30 is a stable structure, and exhibits a stable chemical or physical property, e.g., good thermal stability at a particular temperature range, good vibration tolerance, and good anti-oxidation effect, etc. Therefore, the transferring step can be conducted in an efficient, accurate, and reliable way.

In this disclosure, each of the light emitting units 100 is a micro LED, and may be one of face-up type, flip-chip type, and vertical type. In order to improve light extraction efficiency and bonding efficiency, the flip-chip type is preferable in this embodiment.

In this disclosure, each of the light emitting units 100 has a lateral thickness (i.e., length or width) in a second direction perpendicular to the first direction which ranges from 2 μm to 200 μm, and each of the light emitting units 100 has a thickness in the first direction ranging from 2 μm to 100 μm.

Figure 2:
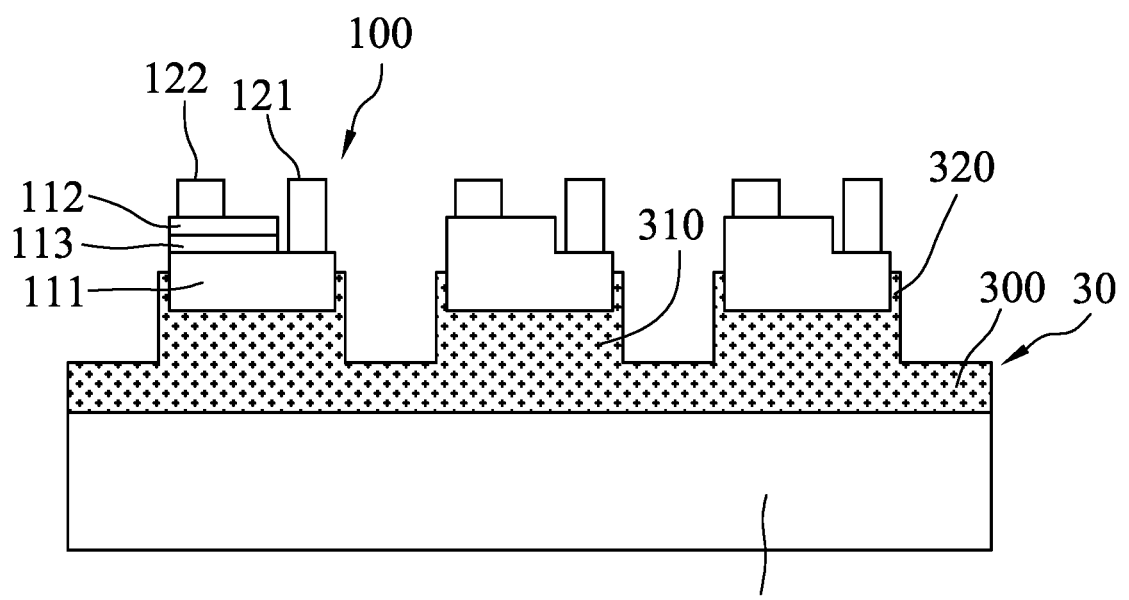
FIG. 2 is a schematic diagram illustrating a modification of the first embodiment according to the disclosure.

Referring to FIG. 2, in a modification of the first embodiment, the extending portion 320 may be designed to have a desired property so as to improve the performance of the light emitting units 100. For example, the extending portion 320 may be made to have total reflection property or an anti-reflection property. The extending portion 320 may have a thickness of less than 3 μm and has a refractive index ranging from 1.2 to 2.5. In this embodiment, the extending portion 320 may be made of an adhesive material. In order to be firmly attached onto the light emitting unit 100, the Shore A hardness of the extending portion 320 may range from 15 to 50. The refractive index of the extending portion 320 may be changed by selecting different material for making the extending portion 320, or by local or bulk doping of the adhesive layer 30.

Figure 3:
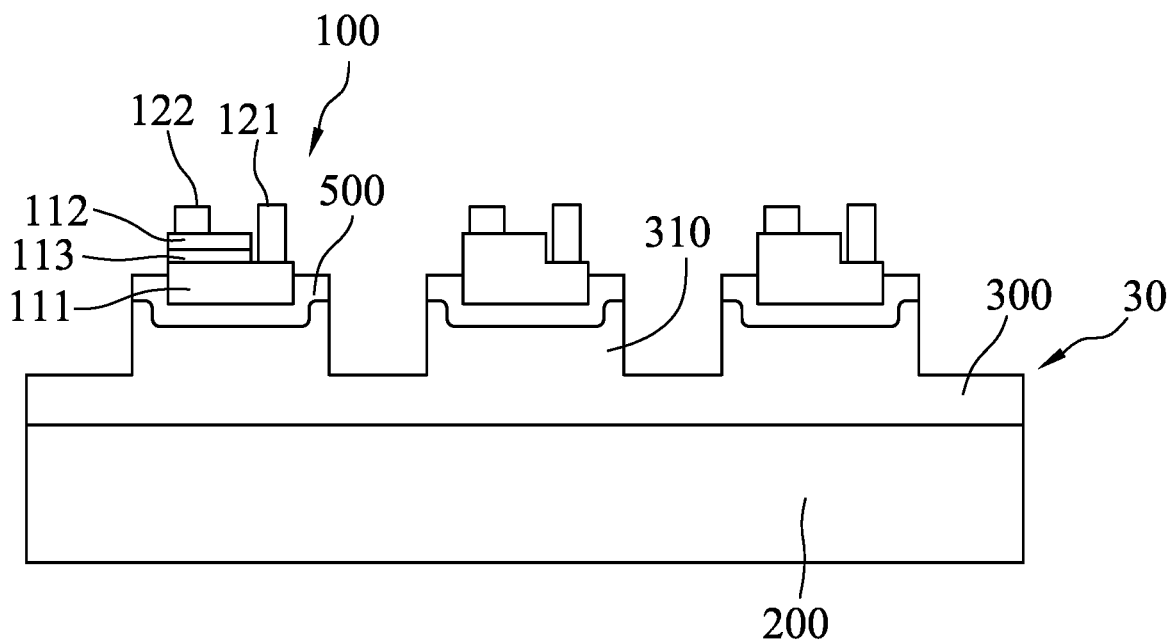
FIG. 3 is a schematic diagram illustrating a second embodiment of the light emitting assembly according to the disclosure.

Referring to FIG. 3, a second embodiment of the light emitting assembly of the disclosure is similar to that of the first embodiment, except that the light emitting assembly of the second embodiment further includes a protective layer 500 for enhancing the reliability of the light emitting assembly. The protective layer 500 is disposed between the adhesive layer 30 and the light emitting units 100. In certain embodiments, the protective layer 500 is further connected to a lateral surface of each of the light emitting units 100. The function of the protective layer 500 includes anti-corrosion, anti-moisture, or anti-oxidation. For example, the protective layer 500 can be used to prevent oxidation of the light emitting units 100. Besides, the protective layer 500 can be used to improve the light-emitting reliability of the light emitting units 100 in a humid environment. The protective layer 500 may be made of a rigid material or a soft material. The protective layer 500 is made of, e.g., silicon, silicon oxide, silicon nitride, or epoxy. In a modification of the second embodiment, the protective layer 500 may be made of an encapsulation material or a wavelength conversion material so as to simplify the encapsulation process.

Figure 4:
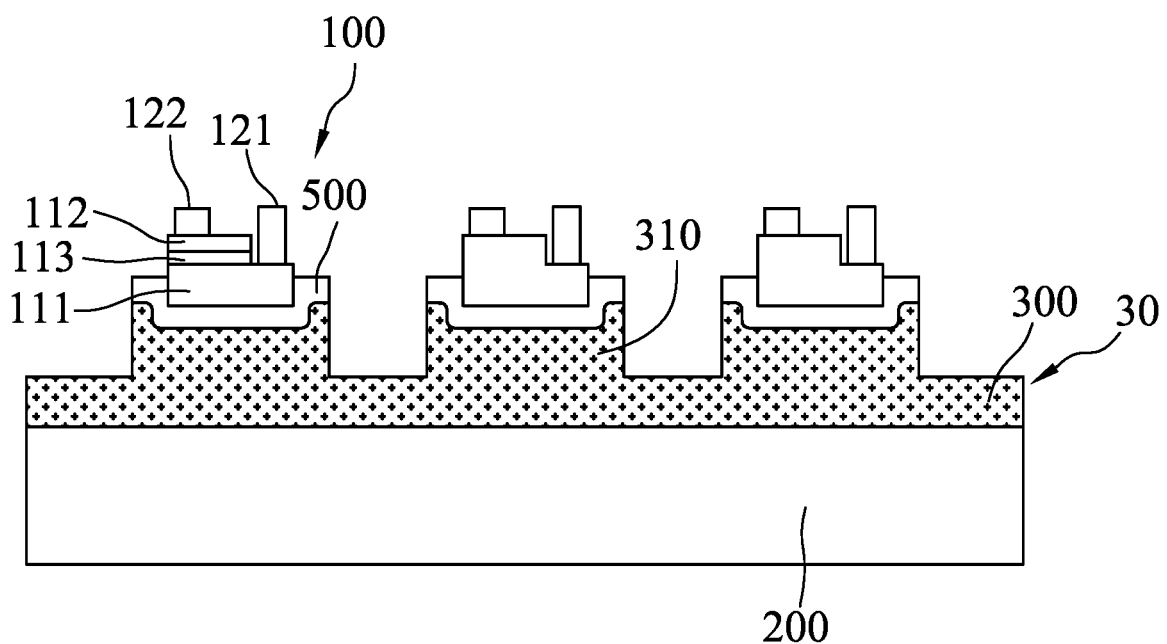
FIG. 4 is a schematic diagram illustrating a third embodiment of the light emitting assembly according to the disclosure.

Referring to FIG. 4, a third embodiment of the light emitting assembly of the disclosure is substantially similar to the modification of the first embodiment and the second embodiment. In this embodiment, the material of the adhesive layer 30 has optical characteristics similar to that of the modification of the first embodiment, and the protective layer 500 is disposed between the adhesive layer 30 and the light emitting units 100. It should be noted that, when the material of the adhesive layer 30 affects the performance of the light emitting units 100, the protective layer 500, which has an isolating effect, may be used to cover the light emitting units 100 so as to isolate the light emitting units 100 from the adhesive layer 30.

Figure 5:
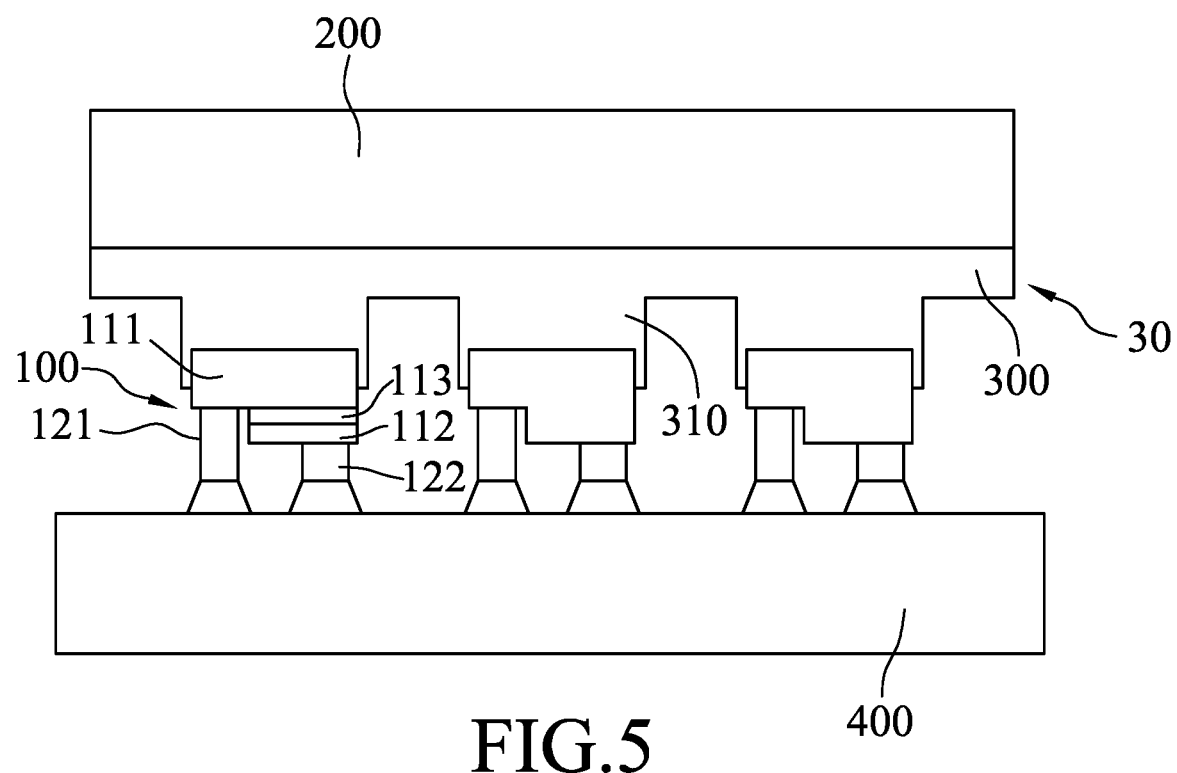
FIG. 5 is a schematic diagram illustrating an embodiment of a light emitting apparatus according to the disclosure, including the first embodiment of the light emitting assembly and a circuit board.

FIG. 5 discloses an embodiment of a light emitting apparatus including the light emitting assembly of any one of the abovementioned embodiments and the circuit board 400. The light emitting units 100 of the light emitting assembly are electrically connected to the circuit board 400. The circuit board 400, for example, has switches for controlling on-off function and luminance of the light emitting units 100. The number of the switches may be equal to the number of the light emitting units 100. The circuit board 400 may include one or more series circuits according to actual requirements.

In a modification of the embodiment of the light emitting apparatus, the substrate 200 may be dispensed with. In a further modification of the embodiment, the substrate 200 and the adhesive layer 300 may be dispensed with (see FIG. 8).

Figure 7:
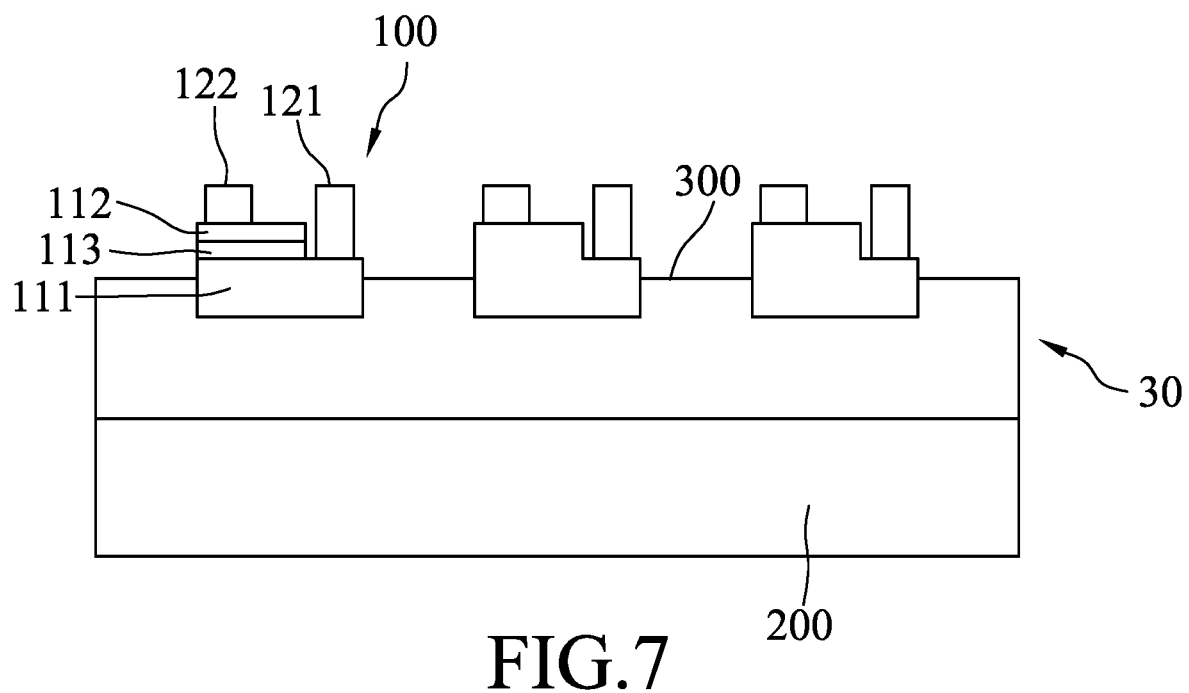

This disclosure also provides an embodiment of a method for making the light emitting assembly. The method includes: forming the adhesive layer 30 on the substrate 200; providing a plurality of the light emitting units 100 that are divided into multiple groups; and attaching the light emitting units 100 to the adhesive layer 30 so as to obtain the light emitting assembly (see FIG. 7).

Figure 6:
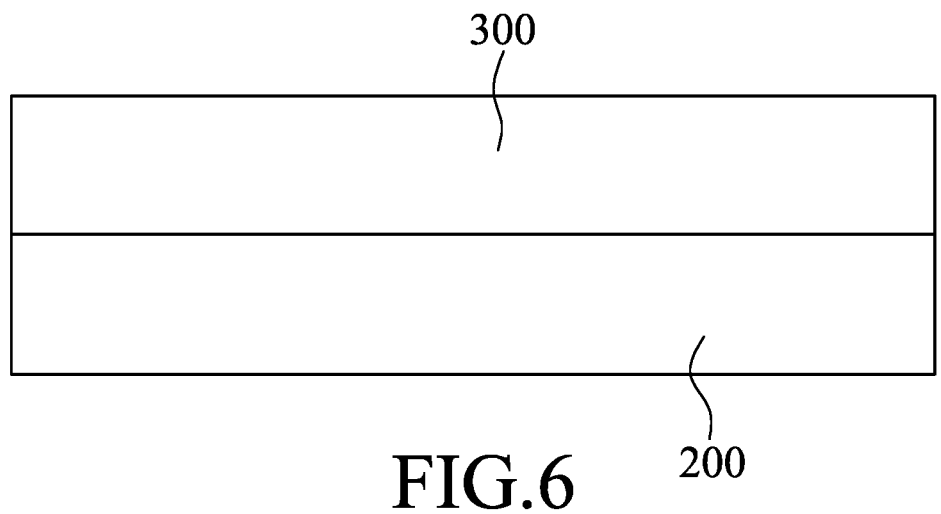
FIG. 6 and FIG. 7 are schematic diagrams illustrating an embodiment of a method for making the light emitting assembly according to the disclosure.

As shown in FIG. 6, the substrate 200 serves as a temporary substrate for supporting the light emitting units 100. The adhesive layer 30 is applied on the substrate 200 through, e.g., a printing process.

The light emitting units 100 can be arranged to match the layout of the circuit board 400. The light emitting units 100 are divided into multiple groups based on the aforesaid predetermined classification rule. Such groups of the light emitting units 100 are sequentially attached to the adhesive layer 30 (i.e., in a batch manner). In this embodiment, the light emitting units 100 are divided into two different groups. In the attaching step, one of the groups is first attached to the adhesive layer 30, and then the other one of the groups is attached to the adhesive layer 30. In this embodiment, the first electrode 121 and the second electrode 122 of each of the light emitting units 100 face away from the adhesive layer 30.

The method may further include a step of removing apart of the adhesive layer 30 between two of the light emitting units 100 so as to form the base portion 300 and a plurality of protrusions 310 that are disposed on the base portion 300 and that are spaced apart from each other. Each of the protrusions 310 is a platform and is connected to a respective one of the light emitting units 100. This step may be conducted before the light emitting units 100 are attached to the adhesive layer 30.

In a modification of the embodiment of the method for making the light emitting assembly, before the step of attaching the light emitting units 100 to the adhesive layer 30, the protective layer 500 is applied on the adhesive layer 30 to improve the reliability of light emitting assembly. The protective layer 500 may be discretely or continuously applied on the adhesive layer 30. When the protective layer 500 is discretely applied, the position of the protective layer 500 corresponds to the position of each of the light emitting units 100. Therefore, the protective layer 500 is able to provide a superior protection to each of the light emitting units 100. In certain embodiments, the adhesive layer 30 are further subjected to a local or bulk doping procedure so as to confer protection ability to the doped adhesive layer 30. In the step of removing the adhesive layer 30 from the light emitting units 100, the protective layer 500 may be used to prevent the adhesive layer 30 from remaining on the light emitting units 100, so as to decrease the optical defects of the light emitting units 100.

This disclosure further provides an embodiment of a method for making the light emitting apparatus. The method includes the abovementioned steps of the method for making the light emitting assembly, and further includes the step of bonding the light emitting assembly shown in FIG. 7 to the circuit board 400.

The circuit board 400 is designed to control the light emitting units 100.

Figure 8:
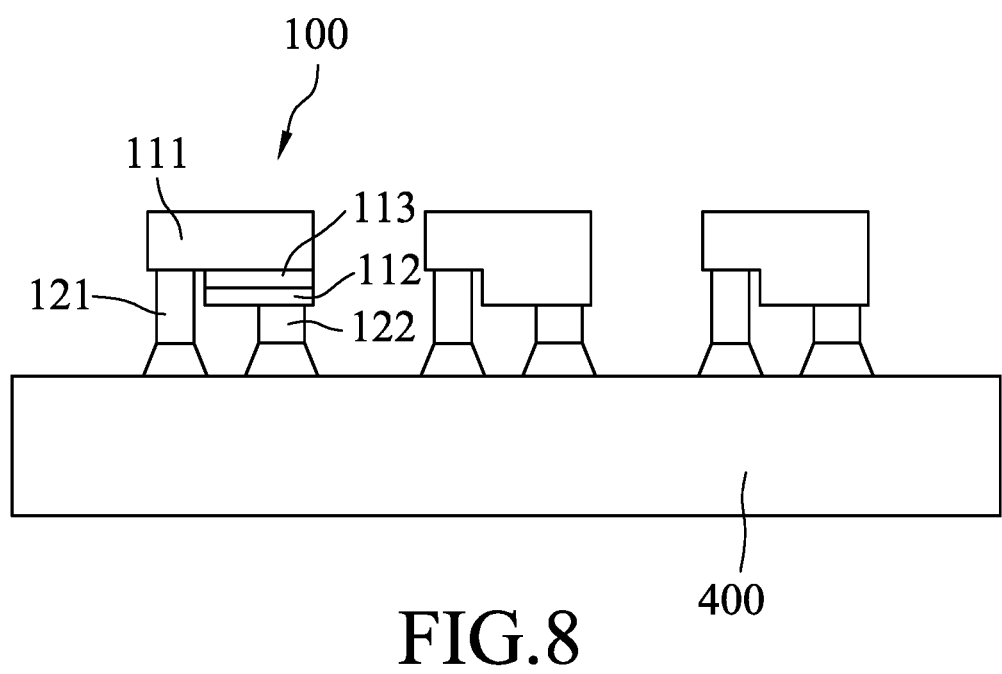
FIG. 8 is a schematic diagram illustrating a modification of the embodiment of the light emitting apparatus according to the disclosure.

As shown in FIG. 8, the method of making the light emitting apparatus according to this disclosure further includes the step of, after the bonding step, removing the substrate 200 and the adhesive layer 30 to improve the light emitting efficiency of the light emitting apparatus. In certain embodiments, in accordance with the characteristics of the adhesive layer 30, the adhesive layer 30 may not be removed and may remain on the light emitting units 100. Removal of the adhesive layer 30 may be conducted by chemical or physical decomposition. For example, the adhesive layer 30 may be removed by photolysis or thermolysis.

The advantageous effects of this disclosure include:

(1) arrangement of the light emitting units 100 first on the adhesive layer 30 would improve the efficiency of transferring the light emitting units 100 to the circuit board 400;

(2) different groups of the light emitting units 100 may be first prepared based on customer's requirements, and then sequentially provided on the adhesive layer 30, so as to provide the customer the desired combinations of the light emitting units 100;

(2) as compared to the conventional method that involves the step of transferring the light emitting units 100 to the circuit board 400 for multiple times, in the method of this disclosure, the light emitting units 100 with different specifications are transferred to the circuit board 400 at one time so as to reduce damage to the circuit board 400;

(3) the design of the protrusions 310 would reduce the force exerted by the adhesive layer 30 to the light emitting units 100 in the transferring step;

(4) in the method of making the light emitting assembly, the thickness of the protrusions 310 is designed to be larger than that of the light emitting units 100 or each of the protrusions 310 has a height ranging from 10 μm to 100 μm such that the light emitting units 100 are prevented from being damaged by the bend of the substrate 200;

(5) the extending portion 320 of the adhesive layer 30 is designed to have optical properties so as to provide other optical functions to the light emitting assembly; and (6) the protective layer 500 can reduce or prevent damage to the light emitting units 100.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for making a light emitting assembly, comprising:

forming an adhesive layer on a substrate, wherein said adhesive layer is fabricated from at least one material selected from a group consisting of polyimide, hydrolysis glue, and silica gel, the adhesive layer being formed with a plurality of protrusions, and each protrusion having an extending portion;

providing a plurality of light emitting units and dividing said plurality of light emitting units into two groups; and attaching one of the two groups of the light emitting units to the adhesive layer, followed by attaching the other of the two groups of the light emitting units to the adhesive layer, each of the light emitting units of the two groups being attached to a respective one of the plurality of protrusions with a corresponding extending portion thereof at least partially covering a lateral surface of the attached light emitting unit, and the two groups being at least one of different in light color, light color combination, arrangement of the light emitting units, and structure of the light emitting units.

2. The method as claimed in claim 1, wherein the plurality of protrusions are formed by removing a part of the adhesive layer, the plurality of protrusions thereby being formed on a base portion and being disposed on the base portion in spaced apart relationship from each other.

3. The method as claimed in claim 1, wherein each of the light emitting units includes a first electrode and a second electrode that face away from the adhesive layer.

4. A method for making a light emitting assembly, comprising:

forming an adhesive layer on a substrate, wherein said adhesive layer is fabricated from at least one material selected from a group consisting of polyimide, hydrolysis glue, and silica gel, the adhesive layer being formed with a plurality of protrusions, each protrusion having a recess formed therein, and a protective layer is formed on each of the plurality of protrusions with at least a portion of the protective layer being disposed in the recess of a corresponding protrusion;

providing a plurality of light emitting units and dividing said plurality of light emitting units into two groups; and attaching one of the two groups of the light emitting units to the protective layer of a portion of the protrusions, followed by attaching the other of the two groups of the light emitting units to the protective layer of a remaining portion of the plurality of protrusions, and the two groups being at least one of different in light color, light color combination, arrangement of the light emitting units, and structure of the light emitting units, wherein the protective layer of each of the plurality of protrusions is connected to a lateral surface of a corresponding one of the light emitting units.

* * * * *